(12) United States Patent
Hsu

(10) Patent No.: US 8,008,580 B2
(45) Date of Patent: Aug. 30, 2011

(54) FLEXIBLE PRINTED CIRCUIT BOARD

(75) Inventor: Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 350 days.

(21) Appl. No.: 12/430,134

(22) Filed: Apr. 27, 2009

(65) Prior Publication Data
US 2010/0258338 A1  Oct. 14, 2010

(30) Foreign Application Priority Data

Apr. 13, 2009 (CN) .......................... 2009 1 0301507

(51) Int. Cl.
*H05K 1/00* (2006.01)
(52) U.S. Cl. ........................................ 174/254; 361/794
(58) Field of Classification Search .................. 174/254, 174/255, 261, 27, 36, 113 R; 361/777, 780, 361/794–796; 333/5, 33, 238; 257/662, 257/664, 698; 29/847
See application file for complete search history.

(56) References Cited

U.S. PATENT DOCUMENTS

| | | | | |
|---|---|---|---|---|
| 4,680,557 A * | 7/1987 | Compton | ........................... | 333/1 |
| 5,003,273 A * | 3/1991 | Oppenberg | ....................... | 333/1 |
| 6,420,778 B1 * | 7/2002 | Sinyansky | .................... | 257/664 |
| 7,235,457 B2 * | 6/2007 | Forbes et al. | ................. | 438/422 |
| 7,609,125 B2 * | 10/2009 | van Quach et al. | ............... | 333/5 |
| 2005/0201072 A1 * | 9/2005 | He et al. | ........................ | 361/794 |

* cited by examiner

*Primary Examiner* — Yuriy Semenenko
(74) *Attorney, Agent, or Firm* — Altis Law Group, Inc.

(57) ABSTRACT

A flexible printed circuit board (FPCB) includes a signal layer, upper and lower ground layers, and two dielectric layers. The signal layer includes a differential pair comprising two transmission lines to transmit a pair of differential signal. The dielectric layers are respectively located on and under the signal layer to sandwich the signal layer. The upper ground layer is attached to the dielectric layer on the signal layer. The lower ground layer is attached to the dielectric layer under the signal layer. Each ground layer defines a void therein aligning with the differential pair. Dielectric coefficients of the two dielectric layers are different.

5 Claims, 2 Drawing Sheets

FLEXIBLE PRINTED CIRCUIT BOARD

CROSS-REFERENCES TO RELATED APPLICATION

Relevant subject matter is disclosed in co-pending U.S. patent applications entitled "FLEXIBLE PRINTED CIRCUIT BOARD" respectively filed on Nov. 29, 2007 with application Ser. No. 11/946,859, filed on Dec. 5, 2007 with application Ser. No. 11/951,290, filed on Jun. 3, 2008 with application Ser. No. 12/132,067, and filed on Sep. 15, 2008 with application Ser. No. 12/211,057, and assigned to the same assignee as that of the present application.

BACKGROUND

1. Technical Field

The present disclosure relates to flexible printed circuit boards (FPCBs) and, particularly, to an FPCB for transmitting high speed signals.

2. Description of Related Art

FPCBs are light, soft, thin, small, ductile, flexible, and supporting high wiring density. FPCBs can be three-dimensionally wired and shaped according to space limitations. Flexible circuits are generally useful for electronic packages where flexibility, weight control and the like are important.

Referring to FIG. 1, a related-art FPCB includes a signal layer and a ground layer 50. A differential pair 51 consisting of two transmission lines 52 and 54 is arranged in the signal layer. The ground layer 50 is beneath the signal layer and etched in a grid array. The layout in the ground layer 50 beneath the transmission line 52 is different from that beneath the transmission line 54, noise is easily generated, which prevents the FPCB from transmitting high speed signals.

DETAILED DESCRIPTION

Figure 1:
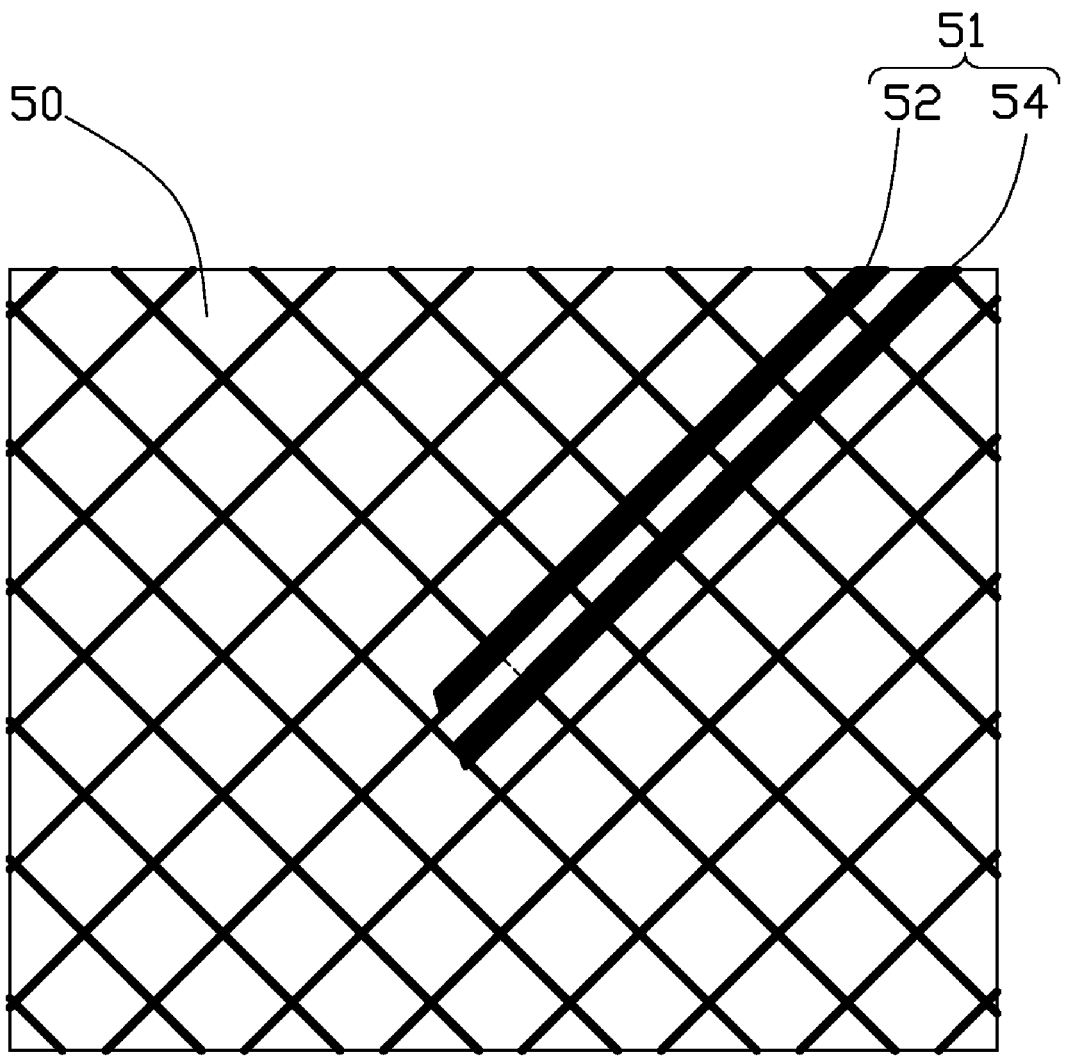
FIG. 1 is a schematic diagram of a related-art FPCB.
Figure 2:
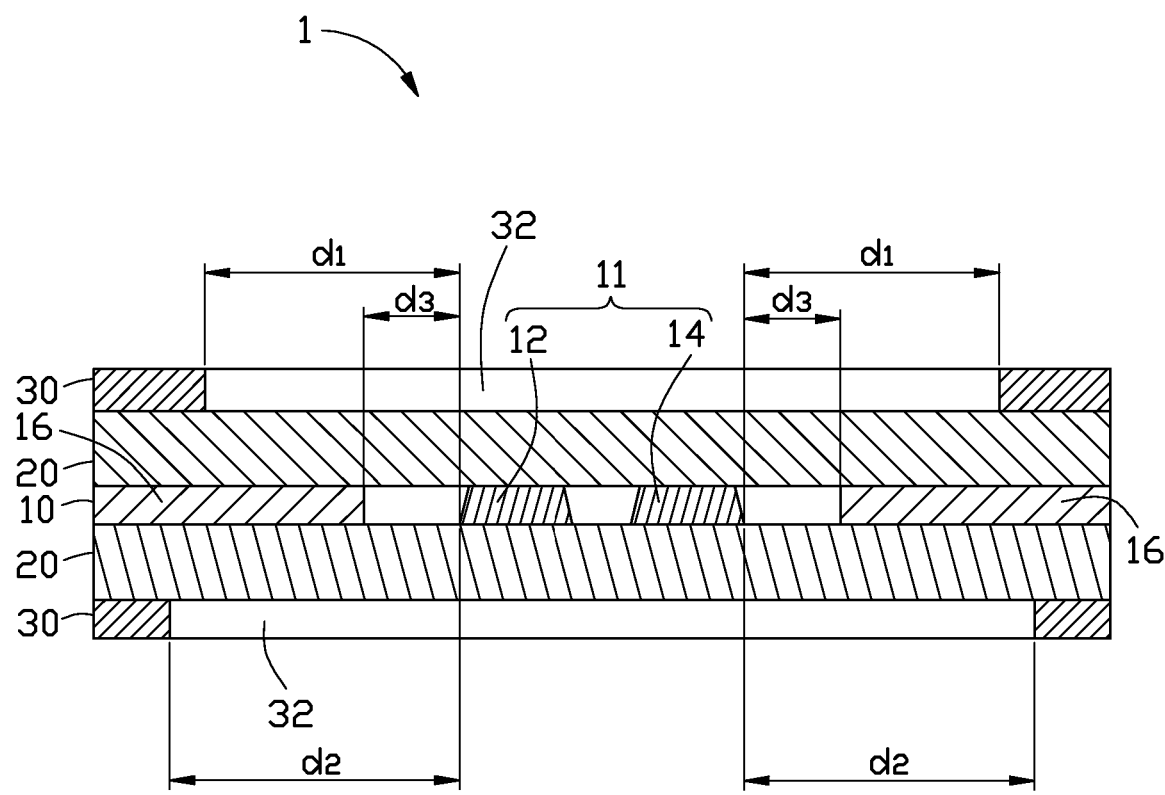
FIG. 2 is a cross-sectional view of an exemplary embodiment of an FPCB.

Referring to FIG. 2, an exemplary embodiment of a flexible printed circuit board (FPCB) 1 includes a signal layer 10, two dielectric layers 20 located on and under the signal layer 10 to sandwich the signal layer 10, and two ground layers 30 attached to the dielectric layers 20 and opposite to the signal layer 10 respectively. Dielectric coefficients of the two dielectric layers 20 are different.

A differential pair 11 comprising two transmission lines 12, 14 is arranged in the signal layer 10, to transmit a pair of differential signals. The ground layers 30 are covered with conductive material, such as copper. A void 32 is defined in each ground layer 30, aligning with the transmission lines 12 and 14. Each void 32 is formed by cutting away the conductive material aligned with the transmission lines 12 and 14. Thus, the problem of low characteristic impedance of the transmission lines 12 and 14, which is caused by a distance between the differential pair 11 and each ground layer 30 being too short, is avoided. There is a first horizontal distance d1 between each edge of the void 32 of an upper ground layer 30 of the ground layers 30 and a nearest transmission line 12 or 14. There is a second horizontal distance d2 between each edge of the void 32 of a lower ground layer 30 of the ground layers 30 and a nearest transmission line 12 or 14. The first horizontal distance d1 and the second horizontal distance d2 are different. Two sheets 16 made of conductive material, such as copper, are respectively arranged on the signal layer 10, at opposite sides of the differential pair 11 and parallel to the transmission lines 12 and 14, and coupled to ground. There is a third horizontal distance d3 between each sheet 16 and a nearest transmission line 12 or 14.

Lengths of the horizontal distances d1, d2, and d3 are obtained by simulating the FPCB 1 of FIG. 2 using a simulation software, simulating the signal type to be transmitted through the transmission lines 12 and 14 and the desired impedance of the transmission lines 12 and 14, and adjusting the horizontal distances d1, d2, and d3 until desired characteristic impedances of the transmission lines 12 and 14 are achieved. The distance d1, d2, d3 are also affected by the following factors: the widths of the transmission lines 12, 14; a distance between the transmission lines 12 and 14; widths of the sheets 16; thicknesses of the dielectric layers 20; and dielectric coefficients of the two dielectric layers 20.

The layout aligning with the transmission line 12 and the layout aligning with the transmission line 14 of each ground layer 30 are the same, therefore the noise caused by the grid array construction of the ground layer is reduced, and the impedances of the transmission lines 12 and 14 are matched, so the FPCB 1 can transmit high speed signals with little noise.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A flexible printed circuit board (FPCB), comprising:
    a signal layer comprising a differential pair, the differential pair comprising two transmission lines to transmit a pair of differential signals;
    two dielectric layers respectively located on and under the signal layer to sandwich the signal layer, wherein dielectric coefficients of the two dielectric layers are different; and
    an upper ground layer and a lower ground layer, wherein the upper ground layer is attached to the dielectric layer on the signal layer, opposite to the signal layer; wherein the lower ground layer is attached to the dielectric layer under the signal layer, opposite to the signal layer; wherein each of the upper and lower ground layers defines a void aligning with the differential pair, wherein there is a first horizontal distance between each edge of the void of the upper ground layer and a nearest transmission line of the transmission lines, there is a second horizontal distance between each edge of the void of the lower ground layer and a nearest transmission line of the transmission lines, the first and second horizontal distances are different.

2. The FPCB of claim 1, wherein two grounded sheets made of conductive material are arranged on the signal layer, at opposite sides of the differential pair and parallel to the differential pair, wherein each grounded sheet on the signal layer has a third distance from that of the differential pair.

3. The FPCB of claim 2, wherein the conductive material of the two grounded sheets on the signal layer are copper.

4. The FPCB of claim 2, wherein a length of each of the two grounded sheets on the signal layer is equal to a length of the differential pair.

5. The FPCB of claim 1, wherein copper are covered on the ground layers except the voids.

* * * * *